(12) United States Patent
Endo et al.

(10) Patent No.: US 6,908,729 B2
(45) Date of Patent: Jun. 21, 2005

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 236 days.

(21) Appl. No.: 10/278,978

(22) Filed: Oct. 24, 2002

(65) Prior Publication Data
US 2003/0082486 A1 May 1, 2003

(30) Foreign Application Priority Data
Oct. 31, 2001 (JP) ........................................ 2001-334170

(51) Int. Cl.[7] ................................................. G03F 7/26
(52) U.S. Cl. ....................................... 430/328; 430/322
(58) Field of Search ............................. 430/270.1, 296, 430/311, 322, 328, 330, 331

(56) References Cited

U.S. PATENT DOCUMENTS 6,582,891 B1 * 6/2003 Hallock et al. ............. 430/330
6,730,458 B1 * 5/2004 Kim et al. .................. 430/296
2002/0045105 A1 * 4/2002 Brown et al. ................. 430/5

FOREIGN PATENT DOCUMENTS

JP  2002-15971  1/2002

* cited by examiner

Primary Examiner—Kathleen Duda
(74) Attorney, Agent, or Firm—McDermott Will & Emery LLP

(57) ABSTRACT

A resist film is formed from a chemically amplified resist material containing a base polymer including at least one ester out of acrylate and methacrylate and an acid generator that generates an acid when irradiated with light. The resist film is selectively irradiated for pattern exposure with extreme UV of a wavelength of a 1 nm through 30 nm band, and is developed after the pattern exposure, so as to form a resist pattern from an unexposed portion of the resist film. The resist pattern is then annealed, so as to smooth roughness having been caused on the resist pattern.

5 Claims, 4 Drawing Sheets

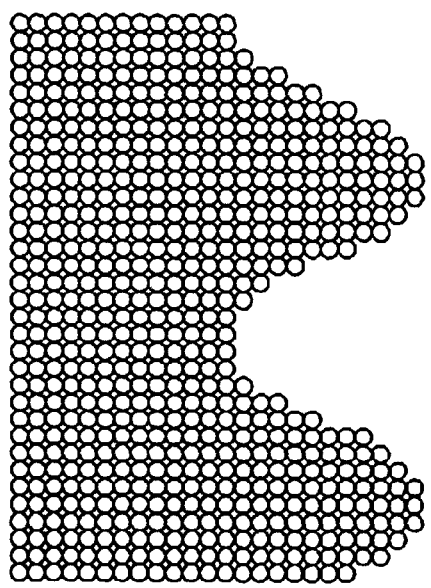 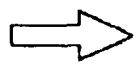 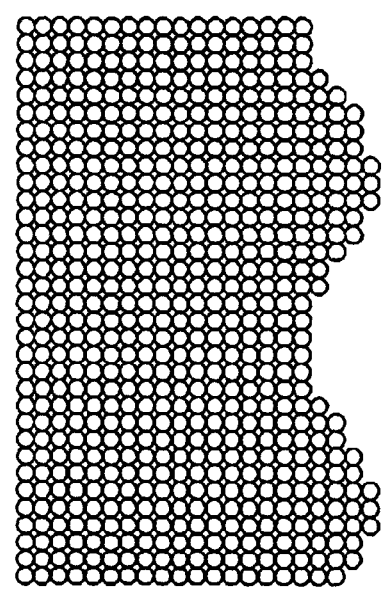
FIG. 3A          FIG. 3B

PATTERN FORMATION METHOD

BACKGROUND OF THE INVENTION

The present invention relates to a pattern formation method in which a resist film made from a chemically amplified resist material is selectively irradiated with extreme UV of a wavelength of a 1 nm through 30 nm band so as to form a resist pattern from an unexposed portion of the resist film.

In processes for semiconductor integrated circuit devices, lithography technique is desired to be further developed in accordance with increase of the degree of integration and downsizing of semiconductor integrated circuits.

As exposing light employed in the lithography technique, a mercury lamp, KrF excimer laser (of a wavelength of a 248 nm band), ArF excimer laser (of a wavelength of a 193 nm band) or the like is currently used. For the generation of 0.1 $\mu$m or less, and particularly of 0.05 $\mu$m or less, extreme UV of a wavelength (of a 1 nm through 30 nm band) shorter than that of the ArF excimer laser is now being examined to be used.

In the lithography technique using extreme UV as the exposing light, a chemically amplified resist material with high resolution and high sensitivity is preferably used.

Therefore, in the lithography technique using extreme UV, a chemically amplified resist material suitable for the ArF excimer laser lasing at a wavelength close to that of extreme UV is now being examined for use.

Now, a pattern formation method using a chemically amplified resist material suitable for the ArF excimer laser will be described with reference to FIGS. 4A through 4D.

First, a chemically amplified resist material having the following composition is prepared:

Base polymer: poly((2-methyl-2-adamantyl acrylate)-(methyl methacrylate)-(methacrylic acid)) (wherein 2-methyl-2-adamantyl acrylate:methyl methacrylate::methacrylic acid=70 mol %:20 mol %:10 mol %) . . . 2 g Acid generator: triphenylsulfonium triflate . . . 0.4 g Solvent: propylene glycol monomethyl ether acetate . . . 20 g Next, as shown in FIG. 4A, the chemically amplified resist material having the aforementioned composition is applied on a semiconductor substrate 1 so as to form a resist film 2 with a thickness of 0.2 $\mu$m.

Then, as shown in FIG. 4B, the resist film 2 is selectively irradiated for pattern exposure with extreme UV 4 (of a wavelength of a 13.5 nm band) through a reflection mask (not shown) having a desired mask pattern. After the pattern exposure, as shown in FIG. 4C, the resist film 2 is subjected to post-exposure bake (PEB) 5 with a hot plate at a temperature of 100° C. for 60 seconds.

In this manner, an exposed portion 2a of the resist film 2 becomes soluble in an alkaline developer owing to a function of an acid generated from the acid generator while an unexposed portion 2b of the resist film 2 remains insoluble in an alkaline developer because no acid is generated from the acid generator therein.

Next, the resist film 2 is developed with an alkaline developer, such as a 2.38 wt % tetramethylammonium hydroxide developer, so as to form a resist pattern 6 with a line width of 0.07 $\mu$m from the unexposed portion 2b of the resist film 2 as shown in FIG. 4D.

However, since large roughness 6 has been caused on the surface of the resist pattern 6, variation in the line width of the resist pattern 6 is disadvantageously large. When the line width of the resist pattern 6 is measured, a difference between the maximum width and the minimum width is as large as approximately 20 nm.

As the design rule of semiconductor integrated circuit devices is reduced, the variation in the sizes of a resist pattern, such as the line width and the dimension of an opening, causes influence more difficult to ignore. Specifically, when a conducting film or an insulating film is etched by using a resist pattern with such size variation, the line width or the dimension of openings can be varied in the resultant pattern, which disadvantageously lowers the accuracy of a semiconductor integrated circuit device.

SUMMARY OF THE INVENTION

In consideration of the above-described conventional problem, an object of the invention is reducing size variation of a resist pattern.

In order to achieve the object, the first pattern formation method of this invention includes the steps of forming a resist film from a chemically amplified resist material containing a base polymer including at least one ester out of acrylate and methacrylate and an acid generator that generates an acid when irradiated with light; selectively irradiating the resist film for pattern exposure with extreme UV of a wavelength of a 1 nm through 30 nm band; forming a resist pattern from an unexposed portion of the resist film by developing the resist film after the pattern exposure; and smoothing roughness having been caused on the resist pattern by annealing the resist pattern.

Since the first pattern formation method includes the step of smoothing the roughness having been caused on the resist pattern by annealing the resist pattern, size variation of the resist pattern can be reduced.

The second pattern. formation method of this invention includes the steps of forming a resist film from a chemically amplified resist material containing a base polymer including at least one ester out of acrylate and methacrylate and an acid generator that generates an acid when irradiated with light; selectively irradiating the resist film for pattern exposure with extreme UV of a wavelength of a 1 nm through 30 nm band; forming a resist pattern from an unexposed portion of the resist film by developing the resist film after the pattern exposure; and smoothing roughness having been caused on the resist pattern by irradiating the resist pattern with an energy beam.

Since the second pattern formation method includes the step of smoothing the roughness having been caused on the resist pattern by irradiating the resist pattern with the energy beam, the size variation of the resist pattern can be reduced.

In the first or second pattern formation method, the base polymer preferably includes acrylic acid or methacrylic acid.

Also, in the first or second pattern formation method, the extreme UV preferably has a wavelength of a 13.5 nm band.

BRIEF DESCRIPTION OF THE DRAWINGS

FIG. 3A is an enlarged schematic diagram of a resist pattern obtained before third annealing in the pattern formation method of Embodiment 1 and FIG. 3B is an enlarged schematic diagram of the resist pattern obtained after the third annealing in the pattern formation method of Embodiment 1.

DETAILED DESCRIPTION OF THE INVENTION

Embodiment 1

A pattern formation method according to Embodiment 1 of the invention will now be described with reference to FIGS. 1A through 1E.

Figure 1A:
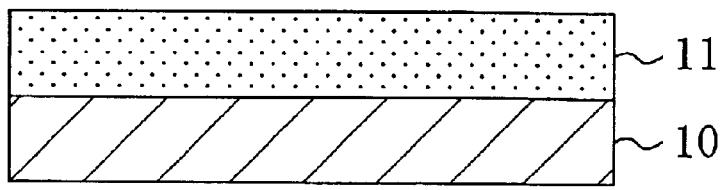
FIGS. 1A, 1B, 1C, 1D and 1E are cross-sectional views for showing procedures in a pattern formation method according to Embodiment 1 of the invention.

First, a chemically amplified resist material having the following composition is prepared:

Base polymer: poly((2-methyl-2-adamantyl acrylate)-(methyl methacrylate)-(methacrylic acid)) (wherein 2-methyl-2-adamantyl acrylate:methyl methacrylate: methacrylic acid=70 mol %:20 mol %:10 mol %) . . . 2 g Acid generator: triphenylsulfonium triflate . . . 0.4 g Solvent: propylene glycol monomethyl ether acetate . . . 20 g Next, as shown in FIG. 1A, the chemically amplified resist material having the aforementioned composition is applied on a semiconductor substrate 10, and the resultant is subjected to pre-bake (first annealing), so as to form a resist film 11 with a thickness of 0.2 $\mu$m.

Figure 1B:
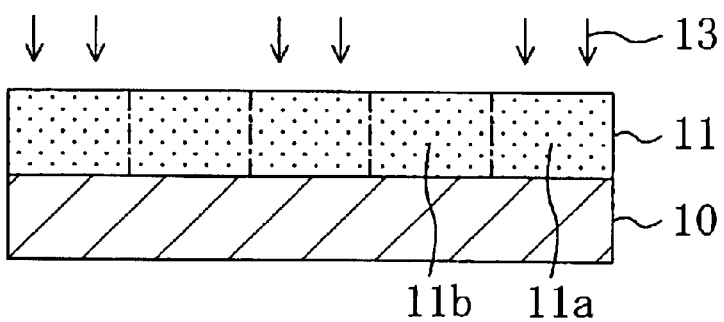
Figure 1C:
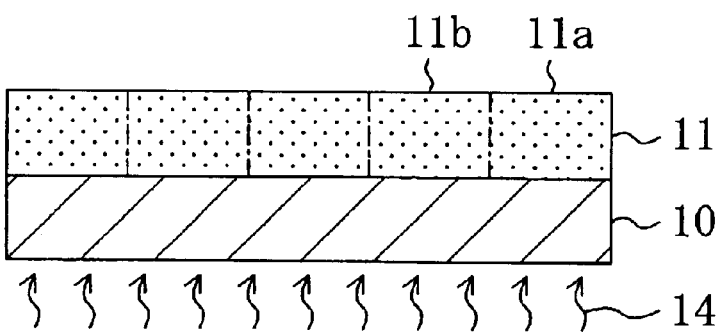

Then, as shown in FIG. 1B, the resist film 11 is selectively irradiated for pattern exposure with extreme UV 13 (of a wavelength of a 13.5 nm band) through a reflection mask (not shown) having a desired mask pattern. After the pattern exposure, the resist film 11 is subjected to post-exposure bake (PEB) 14 (second annealing) with a hot plate at a temperature of 100° C. for 60 seconds as shown in FIG. 1C.

In this manner, an exposed portion 11a of the resist film 11 becomes soluble in an alkaline developer owing to a function of an acid generated from the acid generator while an unexposed portion 11b of the resist film 11 remains insoluble in an alkaline developer because no acid is generated therein.

Figure 1D:
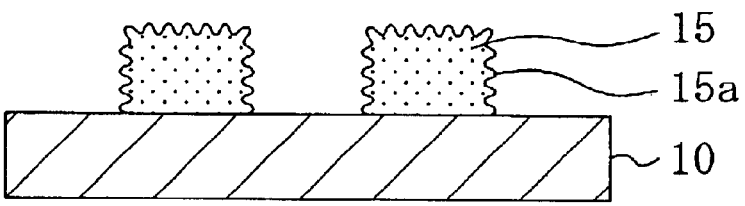

Next, the resist film 11 is developed with an alkaline developer, such as a 2.38 wt % tetramethylammonium hydroxide developer, so as to form a resist pattern 15 with a line width of 0.07 $\mu$m from the unexposed portion 11b of the resist film 11 as shown in FIG. 1D. When the resist pattern 15 is thus formed, large roughness 15a has been caused on the resist pattern 15.

Figure 1E:
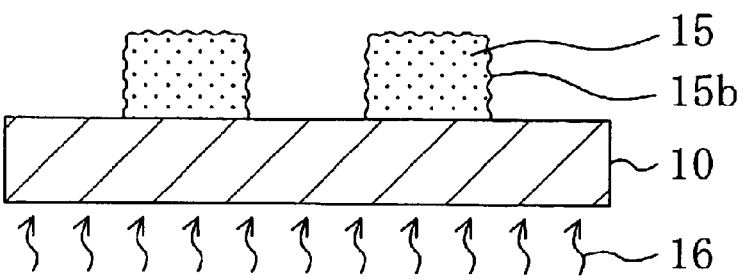

Subsequently, as shown in FIG. 1E, the resist pattern 15 is subjected to annealing (third annealing) 16 at a temperature of, for example, 110° C. for 90 seconds. Thus, the large roughness 15a on the resist pattern 15 is smoothed into small roughness 15b.

When the line width of the resist pattern 15 formed according to Embodiment 1 is measured, a difference between the maximum width and the minimum width is approximately 3 nm, which is much smaller than a width difference (of approximately 20 nm) measured before the third annealing.

FIG. 3A is an enlarged schematic diagram of the resist pattern 15 obtained before the third annealing, and FIG. 3B is an enlarged schematic diagram of the resist pattern 15 obtained after the third annealing.

As is understood from comparison between FIGS. 3A and 3B, it seems that the agglomeration state of the polymer is smoothed through the third annealing of the resist pattern 15. This seems to reduce the width difference between the maximum line width and the minimum line width of the resist pattern 15.

The temperature and the time for performing the third annealing of Embodiment 1 are not particularly specified, and the third annealing is preferably performed at a temperature of 100° C. through 130° C. for approximately 30 through 120 seconds. When the third annealing is thus performed, the roughness 15a on the resist pattern 15 can be smoothed.

Embodiment 2

A pattern formation method according to Embodiment 2 of the invention will now be described with reference to FIGS. 2A through 2E.

Figure 2A:
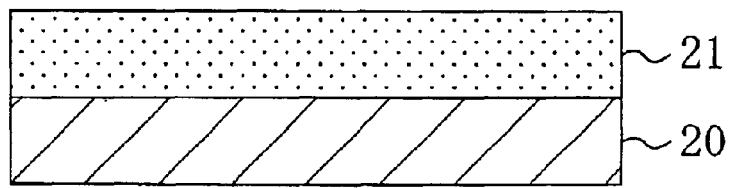
FIGS. 2A, 2B, 2C, 2D and 2E are cross-sectional views for showing procedures in a pattern formation method according to Embodiment 2 of the invention.

First, a chemically amplified resist material having the following composition is prepared:

Base polymer: poly((2-methyl-2-adamantyl acrylate)-(methyl methacrylate)-(methacrylic acid)) (wherein 2-methyl-2-adamantyl acrylate:methyl methacrylate: methacrylic acid=70 mol %:20 mol %:10 mol %) . . . 2 g Acid generator: triphenylsulfonium triflate . . . 0.4 g Solvent: propylene glycol monomethyl ether acetate . . . 20 g Next, as shown in FIG. 2A, the chemically amplified resist material having the aforementioned composition is applied on a semiconductor substrate 20, so as to form a resist film 21 with a thickness of 0.2 $\mu$m.

Figure 2B:
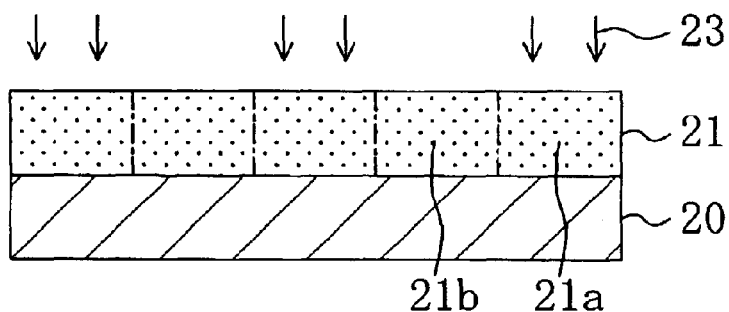
Figure 2C:
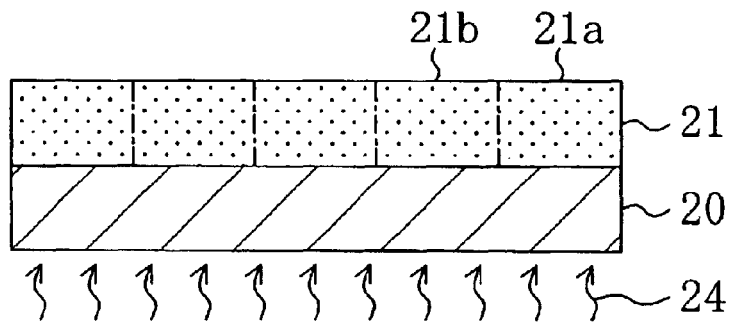

Then, as shown in FIG. 2B, the resist film 21 is selectively irradiated for pattern exposure with extreme UV 23 (of a wavelength of a 13.5 nm band) through a reflection mask (not shown) having a desired mask pattern. After the pattern exposure, the resist film 21 is subjected to post-exposure bake (PEB) 24 with a hot plate at a temperature of 100° C. for 60 seconds as shown in FIG. 2C.

In this manner, an exposed portion 21a of the resist film 21 becomes soluble in an alkaline developer owing to a function of an acid generated from the acid generator while an unexposed portion 21b of the resist film 21 remains insoluble in an alkaline developer because no acid is generated therein.

Figure 2D:
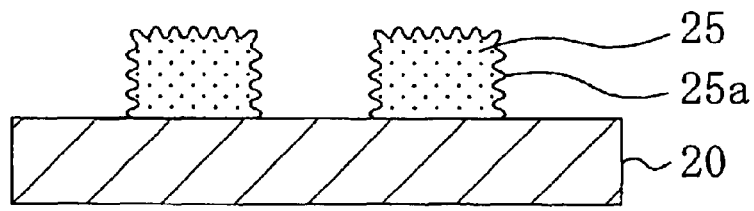

Next, the resist film 21 is developed with an alkaline developer, such as a 2.38 wt % tetramethylammonium hydroxide developer, so as to form a resist pattern 25 with a line width of 0.07 $\mu$m from the unexposed portion 21b of the resist film 21 as shown in FIG. 2D. When the resist pattern 25 is thus formed, large roughness 25a has been caused on the resist pattern 25.

Figure 2E:
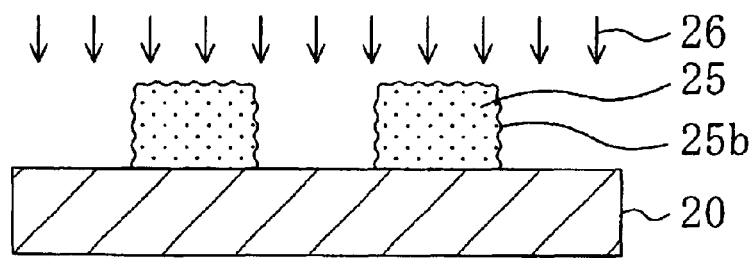
Figure 4A:
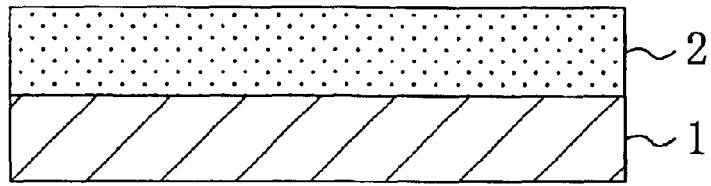
FIGS. 4A, 4B, 4C and 4D are cross-sectional views for showing procedures in a conventional pattern formation method.
Figure 4B:
Figure 4C:
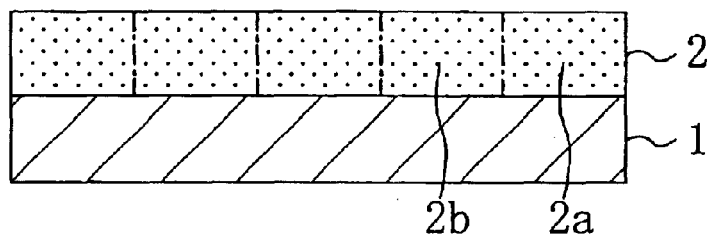
Figure 4D:
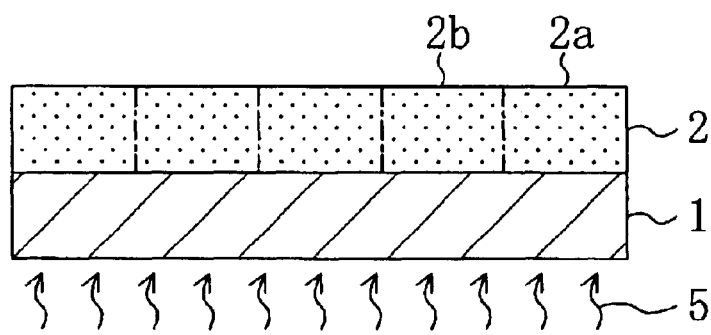

Subsequently, as shown in FIG. 2E, the resist pattern 25 is wholly irradiated with deep UV (of a wavelength of a 0.2 $\mu$m through 0.3 $\mu$m band) serving as an energy beam emitted from a lamp. Thus, the large roughness 25a on the resist pattern 25 is smoothed into small roughness 25b.

When the line width of the resist pattern 25 formed according to Embodiment 2 is measured, a difference between the maximum width and the minimum width is approximately 3 nm, which is much smaller than a width difference (of approximately 20 nm) measured before the irradiation with deep U.

It seems that the agglomeration state of the polymer is smoothed through the irradiation of the resist pattern 25 with deep UV in Embodiment 2. This seems to reduce the width difference between the maximum line width and the minimum line width of the resist pattern 25.

The wavelength and the amount of the energy beam for irradiating the resist pattern 25 are not particularly specified, and the resist pattern 25 may be wholly irradiated with EB (electron beam) or the like instead of deep UV. Also, the energy amount in the irradiation with deep UV is preferably, for example, 10 through 50 mJ/cm$^2$.

The base polymer used in Embodiment 1 or 2 is a polymer including acrylate, methacrylate and methacrylic acid, and other examples of the base polymer are as follows:

(a) Examples of a polymer including methacrylate alone:

poly((2-methyl-2-adamantyl methacrylate)-(mevalonic lactone methacrylate)) (wherein 2-methyl-2-adamantyl methacrylate:mevalonic lactone methacrylate=50 mol %:50 mol %)

poly((2-ethyl-2-adamantyl methacrylate)-(γ-butyrolactone methacrylate)) (wherein 2-ethyl-2-adamantyl methacrylate:γ-butyrolactone methacrylate=50 mol %:50 mol %)

(b) Examples of a polymer including acrylate alone:

poly((2-methyl-2-adamantyl acrylate)-(mevalonic lactone acrylate)) (wherein 2-methyl-2-adamantyl acrylate:mevalonic lactone acrylate=50 mol %:50 mol %)

poly((2-ethyl-2-adamantyl acrylate)-(γ-butyrolactone acrylate)) (wherein 2-ethyl-2-adamantyl acrylate:γ-butyrolactone acrylate=50 mol %:50 mol %)

(c) Examples of a polymer including methacrylate and acrylate:

poly((2-methyl-2-adamantyl acrylate)-(mevalonic lactone methacrylate)) (wherein 2-methyl-2-adamantyl acrylate:mevalonic lactone methacrylate=50 mol %:50 mol %)

poly((2-ethyl-2-adamantyl acrylate)-(γ-butyrolactone methacrylate)) (wherein 2-ethyl-2-adamantyl acrylate:γ-butyrolactone methacrylate=50 mol %:50 mol %)

(d) Examples of a polymer including methacrylate and methacrylic acid:

poly((2-methyl-2-adamantyl methacrylate)-(methyl methacrylate)-(methacrylic acid)) (wherein 2-methyl-2-adamantyl methacrylate:methyl methacrylate:methacrylic acid=70 mol %:20 mol %:10 mol %)

poly((2-ethyl-2-adamantyl methacrylate)-(methyl methacrylate)-(methacrylic acid) (wherein 2-ethyl-2-adamantyl methacrylate:methyl methacrylate:methacrylic acid=70 mol %:20 mol %:10 mol %)

(e) Examples of a polymer including methacrylate and acrylic acid:

poly((2-methyl-2-adamantyl methacrylate)-(methyl methacrylate)-(acrylic acid)) (wherein 2-methyl-2-adamantyl methacrylate:methyl methacrylate:acrylic acid=70 mol %:20 mol %:10 mol %)

poly((2-ethyl-2-adamantyl methacrylate)-(methyl methacrylate)-(acrylic acid)) (wherein 2-ethyl-2-adamantyl methacrylate:methyl methacrylate:acrylic acid=70 mol %:20 mol %:10 mol %)

(f) Examples of a polymer including acrylate and methacrylic acid:

poly((2-methyl-2-adamantyl acrylate)-(methyl acrylate)-(methacrylic acid)) (wherein 2-methyl-2-adamantyl acrylate:methyl acrylate:methacrylic acid=70 mol %:20 mol %:10 mol %)

poly((2-ethyl-2-adamantyl acrylate)-(methyl acrylate)-(methacrylic acid)) (wherein 2-ethyl-2-adamantyl acrylate:methyl acrylate:methacrylic acid=70 mol %:20 mol %:10 mol %)

(g) Examples of a polymer including acrylate and acrylic acid:

poly((2-methyl-2-adamantyl acrylate)-(methyl acrylate)-(acrylic acid)) (wherein 2-methyl-2-adamantyl acrylate:methyl acrylate:acrylic acid=70 mol %:20 mol %:10 mol %)

poly((2-ethyl-2-adamantyl acrylate)-(methyl acrylate)-(acrylic acid)) (wherein 2-ethyl-2-adamantyl acrylate:methyl acrylate:acrylic acid=70 mol %:20 mol %:10 mol %)

(h) Examples of a polymer including methacrylate, methacrylic acid and acrylic acid:

poly((2-methyl-2-adamantyl methacrylate)-(methyl methacrylate) (methacrylic acid)-(acrylic acid)) (wherein 2-methyl-2-adamanatyl methacrylate:methyl methacrylate:methacrylic acid:acrylic acid=70 mol %:20 mol %:5 mol %:5 mol %)

poly((2-ethyl-2-adamantyl methacrylate)-(methyl methacrylate)-(methacrylic acid)-(acrylic acid)) (wherein 2-ethyl-2-adamantyl methacrylate:methyl methacrylate:methacrylic acid:acrylic acid=70 mol %:20 mol %:5 mol %:5 mol %)

(i) Examples of a polymer including acrylate, methacrylic acid and acrylic acid:

poly((2-methyl-2-adamantyl acrylate)-(methyl acrylate)-(methacrylic acid)-(acrylic acid)) (wherein 2-methyl-2-adamantyl acrylate:methyl acrylate:methacrylic acid:acrylic acid=70 mol %:20 mol %:5 mol %:5 mol %)

poly((2-ethyl-2-adamantyl acrylate)-(methyl acrylate)-(methacrylic acid)-(acrylic acid)) (wherein 2-ethyl-2-adamantyl acrylate:methyl acrylate:methacrylic acid:acrylic acid=70 mol %:20 mol %:5 mol %:5 mol %)

(j) Examples of a polymer including methacrylate, acrylate and methacrylic acid:

poly((2-methyl-2-adamantyl acrylate)-(mevalonic lactone methacrylate)-(methacrylic acid)) (wherein 2-methyl-2-adamantyl acrylate:mevalonic lactone methacrylate:methacrylic acid=50 mol %:45 mol %:5 mol %)

poly((2-ethyl-2-adamantyl acrylate)-(γ-butyrolactone methacrylate)-(methacrylic acid)) (wherein 2-ethyl-2-adamantyl acrylate:γ-butyrolactone methacrylate:methacrylic acid=50 mol %:45 mol %:5 mol %)

(k) Examples of a polymer including methacrylate, acrylate and acrylic acid:

poly((2-methyl-2-adamantyl acrylate)-(mevalonic lactone methacrylate)-(acrylic acid)) (wherein 2-methyl-2-adamantyl acrylate:mevalonic lactone methacrylate:acrylic acid=50 mol %:45 mol %:5 mol %)

poly((2-ethyl-2-adamantyl acrylate)-(γ-butyrolactone methacrylate)-(acrylic acid)) (wherein 2-ethyl-2-adamantyl acrylate:γ-butyrolactone methacrylate:acrylic acid=50 mol %:45 mol %:5 mol %)

(l) Examples of a polymer including methacrylate, acrylate, methacrylic acid and acrylic acid:

poly((2-methyl-2-adamantyl acrylate)-(mevalonic lactone methacrylate)-(methacrylic acid)-(acrylic acid)) (wherein 2-methyl-2-adamantyl acrylate:mevalonic lactone methacrylate:methacrylic acid:acrylic acid=48 mol %:45 mol %:5 mol %:2 mol %)

poly((2-ethyl-2-adamantyl acrylate)-(γ-butyrolactone methacrylate)-(methacrylic acid)-(acrylic acid)) (wherein 2-ethyl-2-adamantyl acrylate:γ-butyrolactone methacrylate:methacrylic acid:acrylic acid=48 mol %:45 mol %:5 mol %:2 mol %)

What is claimed is:

1. A pattern formation method comprising the steps of:

forming a resist film from a chemically amplified resist material containing a base polymer including at least one ester out of acrylate and methacrylate and an acid generator that generates an acid when irradiated with light;

selectively irradiating said resist film for pattern exposure with extreme UV of a wavelength of a 1 nm through 30 nm band;

forming a resist pattern from an unexposed portion of said resist film by developing said resist film after the pattern exposure; and smoothing roughness having been caused on said resist pattern by irradiating said resist pattern with a deep UV energy beam.

2. The pattern formation method of claim 1, wherein said base polymer includes acrylic acid or methacrylic acid.

3. The pattern formation method of claim 1, wherein said extreme UV has a wavelength of a 13.5 nm band.

4. The pattern formation method of claim 1, wherein the deep UV energy beam has an energy amount of 10 through 50 $mJ/cm^2$.

5. The pattern formation method of claim 1, wherein a difference in dimension between the maximum line width and the minimum line width of the resist pattern before being irradiated with the energy beam is 20 nm or less.

* * * * *